United States Patent
Cox et al.

(10) Patent No.: US 7,522,000 B2
(45) Date of Patent: Apr. 21, 2009

(54) DESIGN STRUCTURE FOR A SERIAL LINK OUTPUT STAGE DIFFERENTIAL AMPLIFIER

(75) Inventors: Carrie E. Cox, Apex, NC (US); Hayden C. Cranford, Jr., Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/114,984

(22) Filed: May 5, 2008

(65) Prior Publication Data

US 2008/0204137 A1 Aug. 28, 2008

Related U.S. Application Data

(63) Continuation-in-part of application No. 11/531,714, filed on Sep. 14, 2006, now Pat. No. 7,391,266.

(51) Int. Cl.
*H03F 3/45* (2006.01)
(52) U.S. Cl. ........................ 330/261; 341/135
(58) Field of Classification Search ......... 330/252–261, 330/51; 341/135, 155
See application file for complete search history.

(56) References Cited

U.S. PATENT DOCUMENTS

| 5,914,681 | A * | 6/1999 | Rundel ........................ 341/135 |
| 6,118,323 | A | 9/2000 | Chaine et al. |
| 6,208,178 | B1 | 3/2001 | Chen |
| 6,396,315 | B1 | 5/2002 | Morris |
| 6,573,765 | B2 | 6/2003 | Bales et al. |
| 6,624,671 | B2 | 9/2003 | Fotouhi |
| 6,744,298 | B2 | 6/2004 | Yamauchi et al. |
| 2008/0068084 | A1 | 3/2008 | Cranford et al. |

* cited by examiner

*Primary Examiner*—Robert Pascal
*Assistant Examiner*—Hieu P Nguyen
(74) *Attorney, Agent, or Firm*—Patterson & Associates

(57) ABSTRACT

A design structure embodied in a machine readable storage medium for designing, manufacturing, and/or testing a design for protection for the transmission of higher amplitude outputs required of differential amplifiers formed by thin oxide transistors with limited maximum voltage tolerance used where compliance with communication protocol standards requires handling voltages which may, in transition, exceed desirable levels is provided by limiting the voltage across any two device terminals under power down conditions.

4 Claims, 2 Drawing Sheets

US 7,522,000 B2

DESIGN STRUCTURE FOR A SERIAL LINK OUTPUT STAGE DIFFERENTIAL AMPLIFIER

CROSS-REFERENCE TO RELATED APPLICATION

This application is a continuation-in-part of U.S. patent application Ser. No. 11/531,714, filed Sep. 14, 2006, now U.S. Pat. No. 7,391,266 which is herein incorporated by reference.

BACKGROUND OF INVENTION

Field of Invention

This invention generally relates to design structures, and more specifically, design structures for a semiconductor differential amplifier and protecting the amplifier against undesirable effects of transitional power events.

Integrated circuits based on semiconductor manufacturing process are well known. Such devices are understood to be formed by providing a suitable base and then forming electrical circuit components on the substrate. Such devices are understood to be formed with many such components on a single substrate, with such components functioning as transistors, resistors and other elements. Input/output (I/O) controllers, as one example only, are so formed and have components of the types described formed on the substrates supporting the components. This technology is well known and needs no further description here.

Many such integrated circuit devices or chips use as one type of component a differential amplifier. Differential amplifiers have been long recognized in the art, to the extent that there exist entire texts devoted to the characteristics and design of such amplifiers and their inclusion in large scale integrated circuits. The interested reader is referred to such texts for a deeper understanding of the invention here to be described.

Differential amplifiers function due to the imposition of voltages there across, and serve, among other purposes, to amplify the differences between two input voltages (hence the name) and to remove noise otherwise present in signals by operating in so-called common mode. One difficulty encountered with integrated circuits formed by the use of certain technologies is that voltages may be applied across a differential amplifier which result in either signal distortion beyond acceptable limits or damage to the components forming the amplifier. This is particularly true where an Integrated Circuit (IC) chip is made by a technology which is only capable of offering thin oxide transistors with limited maximum voltage tolerance and the element is used in a circumstance where compliance with communication protocol standards requires handling voltages which may, in transition, exceed desirable levels. Even if thick oxide devices are available in a given technology, and might be less susceptible to voltage problems, those devices are often incapable of the speed necessary to support the applications in question.

As device geometries shrink, the maximum supported power supply voltage also decreases. While this allows digital technology to have a higher maximum operating speed, IC I/O must continue to meet minimum output amplitude as dictated by communication standards. Achieving large output amplitudes often requires higher power supply voltages which, when imposed across a minimum geometry device, impair longevity.

SUMMARY OF THE INVENTION

With the foregoing in mind, it is one purpose of this invention to provide a protection for the transmission of higher amplitude outputs required of differential amplifiers in the contexts described. In realizing this purpose, the voltage across any two device terminals is limited under power down conditions.

A design structure embodied in a machine readable storage medium for at least one of designing, manufacturing, and testing a design is provided. The design structure generally includes an apparatus. The apparatus generally includes a differential amplifier circuit, a biasing circuit, and a coupling circuit operatively connected to said differential amplifier circuit and said biasing circuit, wherein the said coupling circuit recognizing a powering down event for said differential amplifier circuit and applying a biasing voltage from said biasing circuit to said differential amplifier circuit during the recognized powering down event, the biasing voltage protecting the differential amplifier circuit against degradation otherwise possible due to voltages imposed during the powering down event.

BRIEF DESCRIPTION OF DRAWINGS

Some of the purposes of the invention having been stated, others will appear as the description proceeds, when taken in connection with the accompanying drawing, in which the differential amplifier circuit of this invention is shown in FIG. 1.

DETAILED DESCRIPTION OF INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention.

Figure 1:
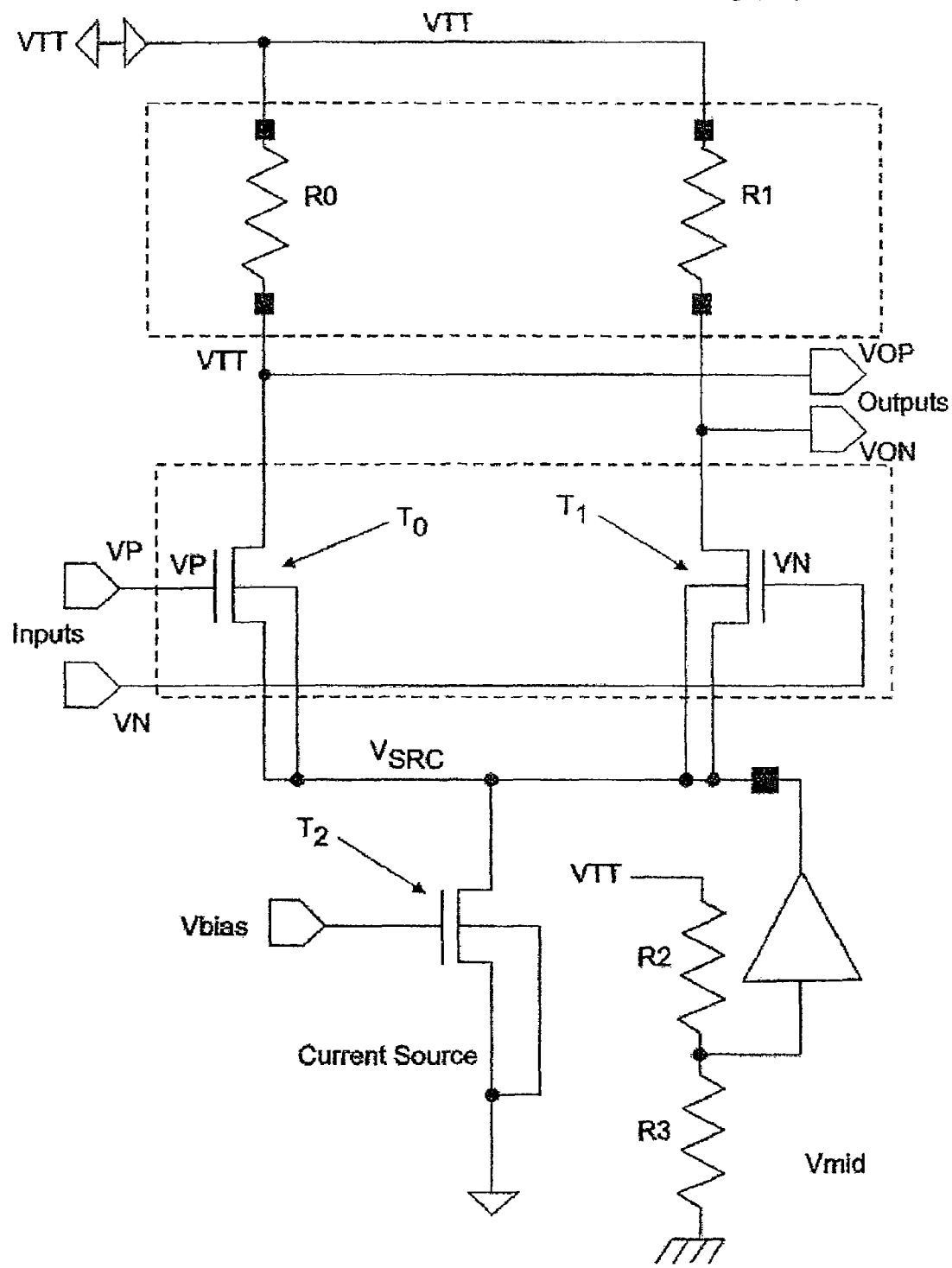

Referring now to FIG. 1. The differential amplifier of this invention is there shown. The elements shown are formed on a substrate (not shown) as is conventional and well known in semiconductor manufacturing. It is the presence of this general knowledge on which reliance is placed for the absence of a specific illustration of the substrate.

The differential amplifier has a plurality of transistors, conductive traces coupling those transistors, and resistors. A differential pair of transistors, $T_0$ and $T_1$, serve as points for input of voltage signals into the amplifier, buffering an input differential voltage, input positive (VP) and input negative (VN). A bias $V_{mid}$ is controllably applied through a voltage buffer which forms a biasing circuit.

The bias applied is controlled by a coupling circuit including a transistor $T_2$ operatively connected to the differential pair and the biasing circuit. The coupling circuit recognizes a powering down event for the differential amplifier circuit and applies a biasing voltage from the biasing circuit to the differential amplifier circuit during the recognized powering down event, the biasing voltage protecting the differential amplifier circuit against degradation otherwise possible due to voltages imposed during the powering down event.

More particularly, and referring to element $T_0$ in the Figure, the drain-source voltage ($V_{ds}=V_{on}-V_{src}$), drain-gate voltage ($V_{dg}=V_{on}-V_p$) and drain-body voltage ($V_{db}=V_{on}-V_{src}$) can all become VTT−0 volts if the node $V_{src}$ isn't set by a voltage buffer and goes to zero volts. This would be an issue when VTT is greater than the voltage allowed for the $T_0$ element, which can occur in a high swing driver in recent CMOS technologies. The presence of the coupling circuit and biasing circuit of this invention protects against the degradation of the semiconductor elements which would occur where this voltage difference is imposed during a power down sequence.

In particular, the apparatus of this invention has a differential amplifier circuit as described and illustrated. Connected to the amplifier circuit are a biasing circuit and a coupling circuit. The coupling circuit recognizes a powering down event for the differential amplifier and applies a biasing voltage from the biasing circuit to the differential amplifier circuit during the recognized powering down event, the biasing voltage protecting the differential amplifier circuit against degradation otherwise possible due to voltages imposed during the powering down event. During a powering down event, the current flowing through the resistors $R_{0\,i}$ and $R_1$ goes to zero. Thus, there is no voltage drop across the resistors and voltage $V_{op}=V_{on}=V_{tt}$ absent the intervention of this invention.

The biasing voltage is applied through a buffer, and may be derived in a number of differing ways. What is shown is exemplary only, as it is recognized and contemplated that the biasing voltage can be derived from a number of sources and through a number of pathways other than from $V_{tt}$ and applied other than through a buffer circuit precisely as shown. The invention here is the intervention rather than the specifics of derivation of the biasing voltage.

Expressed as a method, the present invention contemplates employing a differential amplifier circuit in an environment where a minimum output amplitude must be met for compliance with a communication protocol and protecting the differential amplifier circuit from degradation otherwise possibly occurring by coupling a biasing circuit to the differential amplifier circuit through a coupling circuit which recognizes a powering down event for the differential amplifier circuit and applying a biasing voltage from the biasing circuit to the differential amplifier circuit during the recognized powering down event, the biasing voltage protecting the differential amplifier circuit against degradation otherwise possible due to voltages imposed during the powering down event.

Figure 2:
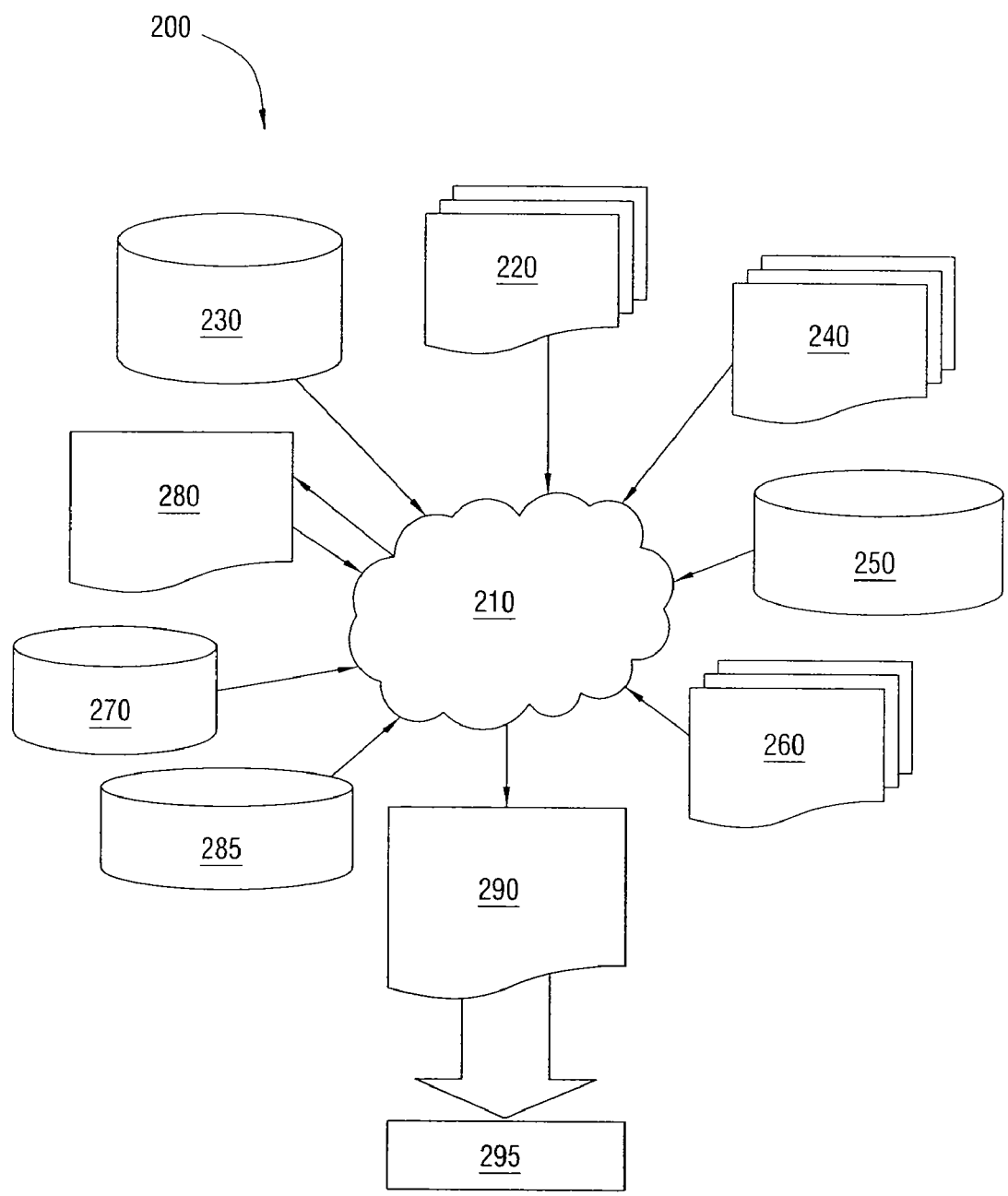
FIG. 2 is a flow diagram of a design process used in semiconductor design, manufacture, and/or test.

FIG. 2 shows a block diagram of an exemplary design flow 200 used for example, in semiconductor design, manufacturing, and/or test. Design flow 200 may vary depending on the type of IC being designed. For example, a design flow 200 for building an application specific IC (ASIC) may differ from a design flow 200 for designing a standard component. Design structure 220 is preferably an input to a design process 210 and may come from an IP provider, a core developer, or other design company or may be generated by the operator of the design flow, or from other sources. Design structure 220 comprises the circuit described above and shown in FIG. 1 in the form of schematics or HDL, a hardware-description language (e.g., Verilog, VHDL, C, etc.). Design structure 220 may be contained on one or more machine readable medium. For example, design structure 220 may be a text file or a graphical representation of a circuit as described above and shown in FIG. 1. Design process 210 preferably synthesizes (or translates) the circuit described above and shown in FIG. 1 into a netlist 280, where netlist 280 is, for example, a list of wires, transistors, logic gates, control circuits, I/O, models, etc. that describes the connections to other elements and circuits in an integrated circuit design and recorded on at least one of machine readable medium. For example, the medium may be a storage medium such as a CD, a compact flash, other flash memory, or a hard-disk drive. The medium may also be a packet of data to be sent via the Internet, or other networking suitable means. The synthesis may be an iterative process in which netlist 280 is resynthesized one or more times depending on design specifications and parameters for the circuit.

Design process 210 may include using a variety of inputs; for example, inputs from library elements 230 which may house a set of commonly used elements, circuits, and devices, including models, layouts, and symbolic representations, for a given manufacturing technology (e.g., different technology nodes, 32 nm, 45 nm, 90 nm, etc.), design specifications 240, characterization data 250, verification data 260, design rules 270, and test data files 285 (which may include test patterns and other testing information). Design process 210 may further include, for example, standard circuit design processes such as timing analysis, verification, design rule checking, place and route operations, etc. One of ordinary skill in the art of integrated circuit design can appreciate the extent of possible electronic design automation tools and applications used in design process 210 without deviating from the scope and spirit of the invention. The design structure of the invention is not limited to any specific design flow.

Design process 210 preferably translates a circuit as described above and shown in FIG. 1, along with any additional integrated circuit design or data (if applicable), into a second design structure 290. Design structure 490 resides on a storage medium in a data format used for the exchange of layout data of integrated circuits (e.g. information stored in a GDSII (GDS2), GL1, OASIS, or any other suitable format for storing such design structures). Design structure 290 may comprise information such as, for example, test data files, design content files, manufacturing data, layout parameters, wires, levels of metal, vias, shapes, data for routing through the manufacturing line, and any other data required by a semiconductor manufacturer to produce a circuit as described above and shown in FIG. 1. Design structure 290 may then proceed to a stage 295 where, for example, design structure 290: proceeds to tape-out, is released to manufacturing, is released to a mask house, is sent to another design house, is sent back to the customer, etc.

In the drawings and specifications there has been set forth a preferred embodiment of the invention and, although specific terms are used, the description thus given uses terminology in a generic and descriptive sense only and not for purposes of limitation.

What is claimed is:

1. A design structure embodied in a machine readable storage medium for at least one of designing, manufacturing, and testing a design, the design structure comprising:

an apparatus comprising:
 a differential amplifier circuit comprising a coupled pair of field effect transistor semiconductor devices, the differential amplifier circuit being employed in an environment where a minimum output amplitude must be met for compliance with a communication protocol;
 a biasing circuit;
 a coupling circuit operatively connected to said differential amplifier circuit and said biasing circuit, the coupling circuit comprising a field effect transistor semiconductor device coupled with the source and body terminals of the coupled pair of field effect transistor semiconductor devices;
 said coupling circuit recognizing a powering down event for said differential amplifier circuit and applying a biasing voltage from said biasing circuit to said differential amplifier circuit during the recognized powering down event, the biasing voltage protecting the differential amplifier circuit against degradation otherwise possible due to voltages imposed during the powering down event.

2. The design structure according to claim 1 wherein said differential amplifier comprises a coupled pair of complementary metal oxide field effect transistor semiconductor devices.

3. The design structure of claim 1, wherein the design structure comprises a netlist, which describes the apparatus.

4. The design structure of claim 1, wherein the design structure resides on the machine readable storage medium as a data format used for the exchange of layout data of integrated circuits.

* * * * *